United States Patent
Lin et al.

(10) Patent No.: US 8,564,018 B2
(45) Date of Patent: Oct. 22, 2013

(54) RELAXED SILICON GERMANIUM SUBSTRATE WITH LOW DEFECT DENSITY

(75) Inventors: Chun Chich Lin, Taichung (TW);
Yee-Chia Yeo, Albany, CA (US);
Chien-Chao Huang, Hsin-Chu (TW);
Chao-Hsiung Wang, Hsin-Chu (TW);
Tien-Chih Chang, Taipei (TW);
Chenming Hu, Alamo, CA (US);
Fu-Liang Yang, Hsin-Chu (TW);
Shih-Chang Chen, Taoyuan (TW);
Mong-Song Liang, Hsin-Chu (TW);
Liang-Gi Yao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 367 days.

(21) Appl. No.: 12/038,091

(22) Filed: Feb. 27, 2008

(65) Prior Publication Data
US 2008/0142842 A1 Jun. 19, 2008

Related U.S. Application Data

(60) Division of application No. 11/074,738, filed on Mar. 8, 2005, now Pat. No. 7,357,838, which is a continuation of application No. 10/228,545, filed on Aug. 27, 2002, now Pat. No. 6,878,610.

(51) Int. Cl.
*H01L 21/02* (2006.01)
(52) U.S. Cl.
USPC ........... 257/190; 257/192; 257/288; 257/616; 257/E21.182; 257/E21.207; 257/E29.193

(58) Field of Classification Search
USPC .................. 257/190, 616, E29.193, E21.182, 257/E21.207, 192, 288
See application file for complete search history.

(56) References Cited

U.S. PATENT DOCUMENTS

| | | | | |
|---|---|---|---|---|
| 5,227,644 | A | * | 7/1993 | Ueno .............................. 257/20 |
| 5,536,962 | A | | 7/1996 | Pfiester |
| 5,759,898 | A | | 6/1998 | Ek et al. |
| 5,847,419 | A | | 12/1998 | Imai et al. |

(Continued)

FOREIGN PATENT DOCUMENTS

EP 0 515 859 A1 12/1992

OTHER PUBLICATIONS

Z. Yang J. Alperin et al., In situ relaxed Si1-xGe-x epitaxial layers with low threading dislocation densities grown on compliant Si-on-insulator substrates, J. Vac. Sci. Technol. B 16(3), May/Jun. 1998, pp. 1489-1491, 1998 American Vacuum Society.

(Continued)

*Primary Examiner* — Jay C Kim
(74) *Attorney, Agent, or Firm* — Haynes and Boone, LLP

(57) ABSTRACT

A structure for an integrated circuit is disclosed. The structure includes a crystalline substrate and four crystalline layers. The first crystalline layer of first lattice constant is positioned on the crystalline substrate. The second crystalline layer has a second lattice constant different from the first lattice constant, and is positioned on said first crystalline layer. The third crystalline layer has a third lattice constant different than said second lattice constant, and is positioned on said second crystalline layer. The strained fourth crystalline layer includes, at least partially, a MOSFET device.

8 Claims, 5 Drawing Sheets

(56) References Cited

U.S. PATENT DOCUMENTS

| | | | |
|---|---|---|---|
| 6,059,895 | A | 5/2000 | Chu et al. |
| 6,111,267 | A * | 8/2000 | Fischer et al. ............. 257/19 |
| 6,291,321 | B1 | 9/2001 | Fitzgerald |
| 6,313,016 | B1 | 11/2001 | Kibbel et al. |
| 6,323,108 | B1 | 11/2001 | Kub et al. |
| 6,331,445 | B1 | 12/2001 | Janz et al. |
| 6,410,371 | B1 * | 6/2002 | Yu et al. ................. 438/151 |
| 6,498,359 | B2 * | 12/2002 | Schmidt et al. ............ 257/190 |
| 6,559,471 | B2 | 5/2003 | Finder et al. |
| 6,583,015 | B2 * | 6/2003 | Fitzgerald et al. ........... 438/287 |
| 6,590,236 | B1 | 7/2003 | El-Zein et al. |
| 6,593,625 | B2 * | 7/2003 | Christiansen et al. ....... 257/347 |
| 6,605,498 | B1 * | 8/2003 | Murthy et al. ............. 438/197 |
| 6,743,651 | B2 * | 6/2004 | Chu et al. ................. 438/46 |
| 6,878,610 | B1 | 4/2005 | Lin et al. |
| 2002/0185686 | A1 * | 12/2002 | Christiansen et al. ....... 257/347 |

OTHER PUBLICATIONS

Kern (Ken) Rim et al., Fabrication and Analysis of Deep Submicron Strained-Si N-MOSFET's, IEEE Transactions on Electron Devices, Jul. 2000, vol. 17, No. 7, pp. 1406-1415.

Konig, U. et al., "p-Type Ge-Channel MODFET's with High Transconductance Grown on Si Substrates," IEEE Electron Device Letters, vol. 14, No. 4, Apr. 1993, 9 pages.

* cited by examiner

RELAXED SILICON GERMANIUM SUBSTRATE WITH LOW DEFECT DENSITY

This is a Divisional of U.S. Ser. No. 11/074,738, filed Mar. 8, 2005, which is a Continuation of U.S. Ser. No. 10/228,545, filed Aug. 27, 2002, now U.S. Pat. No. 6,878,610, issued Apr. 12, 2005, both of which are hereby incorporated by reference in their entirety.

BACKGROUND

The present invention relates to semiconductor devices, and more specifically to structures with a strained silicon layer.

A promising method for improving metal oxide semiconductor field effect transistor (MOSFET) device performance is enhancement of carrier mobility. Both hole and electron mobility enhancement can be accomplished via the employment of surface channel, tensile strained silicon layers. Strained silicon layers used for MOSFET channel regions have been formed via epitaxial growth of silicon on relaxed silicon-germanium (SiGe) pseudo substrates. Good film quality of strained silicon layers, and of relaxed SiGe layers, are important factors for enhanced performance of strained silicon MOSFET devices, however substrate layers exhibiting high defect density, in terms of dislocations, stacking faults, twins, etc., will reduce carrier mobility.

A high quality relaxed SiGe layer, to be subsequently overlaid by a strained silicon layer, can be produced via the use of a thick SiGe buffer layer deposited on an underlying semiconductor substrate. However, there are several disadvantages to the growth of a thick SiGe buffer layer. First, a thick SiGe buffer layer at a thickness greater than a micrometer negatively impacts throughput adding unwanted processing costs. Secondly, the defect density of thick SiGe layers can be as high as 1E7 defects/cm$^2$. The use of a this SiGe buffer layer on a silicon on insulator (SOI) substrate, does allow defect densities to be decreased, however still in the unacceptable range of about 1E6 defects/cm$^2$.

This invention will feature a method of obtaining a desired, strained silicon layer on a relaxed, low defect density semiconductor alloy layer, and an alloy layer such as a SiGe layer. This is accomplished via the growth of the strained silicon layer on an underlying composite layer, which in turn is comprised of a silicon layer sandwiched between two strained layers, such as SiGe layers. As the thickness of the top SiGe strained layer of the composite layer increases via epitaxial growth, dislocations form in the sandwiched, initially unstrained silicon layer, allowing the top, or overlying initially strained alloy layer to relax, and exhibit a low defect density. The desired strained silicon layer is now epitaxially grown on the underlying, relaxed semiconductor alloy layer. A key advantage of this invention is the low dislocation density in the relaxed SiGe layer, underlying the strained silicon layer. Prior art such as Chu, et al., in U.S. Pat. No. 6,059,895, as well as Ek, et al., in U.S. Pat. No. 5,759,898, describe methods of forming tensile strained silicon layers via SiGe relaxed layers, however these prior arts do not describe the novel process sequence disclosed in this present invention in which a strained silicon layer is formed on a relaxed, low defect density, semiconductor alloy layer.

DETAILED DESCRIPTION

Figure 1:
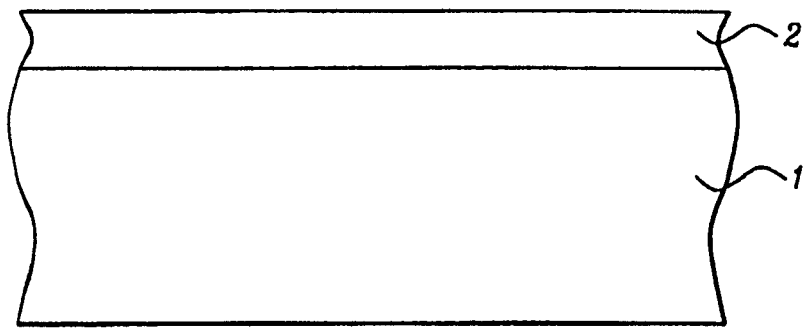
FIGS. 1-5, which schematically, in cross-sectional style, describe key stages of fabrication for obtaining a strained silicon layer on an underlying composite layer, wherein the overlying component of the composite layer is a relaxed, low defect density semiconductor alloy layer.

A method of forming a strained silicon layer on a relaxed, low defect density semiconductor alloy layer, such as SiGe, silicon layer, will now be described in detail. Substrate 1, schematically shown in FIG. 1, can be a semiconductor substrate such as a single crystalline, silicon substrate, or substrate 1, can be silicon on insulator (SOI) substrate. Strained layer 2, a semiconductor alloy layer such as SiGe, is epitaxially grown on substrate 1, via chemical vapor deposition (CVD), or via molecular beam epitaxy, to a thickness below the critical thickness. Strained layer 2, is epitaxially grown using silane, or disilane as a silicon source, while germane is used as the germanium source. Strained layer 2, is kept thin, less than the critical thickness, so that relaxation of this layer does not occur. Strained layer 2, is formed with a natural lattice constant different than the lattice constant of semiconductor substrate 1.

Figure 2:
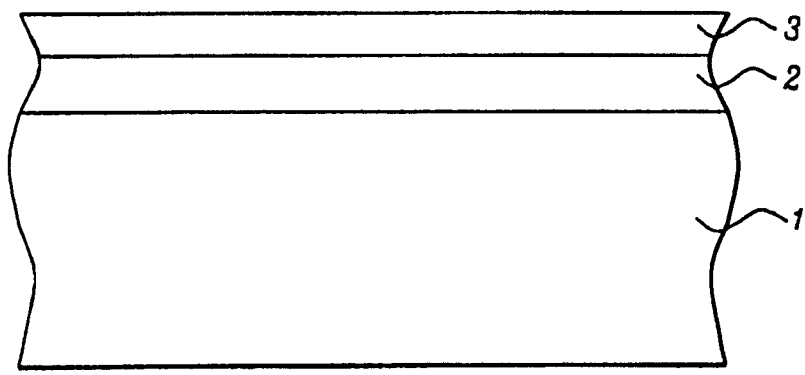

Silicon layer 3, is next epitaxially grown on strained layer 2, to a thickness less than 500 Angstroms. Silicon layer 3, schematically shown in FIG. 2, is epitaxially grown using silane or disilane as a source. Silicon layer 3, is grown with a natural lattice constant different than the natural lattice constant of strained layer 2.

Figure 3:
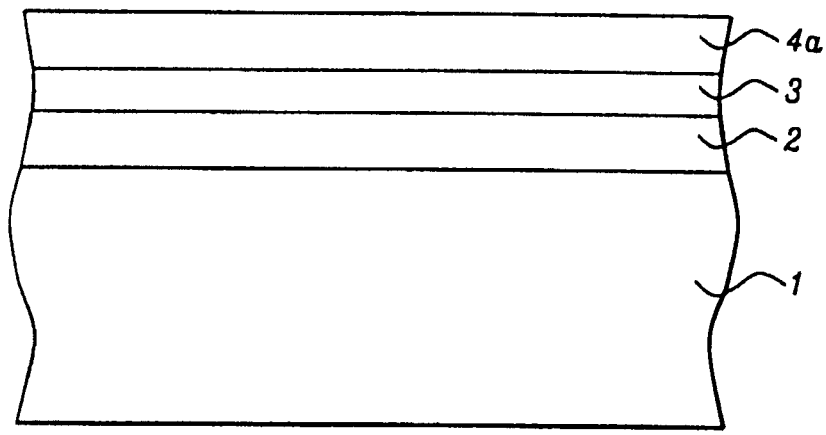
Figure 4:
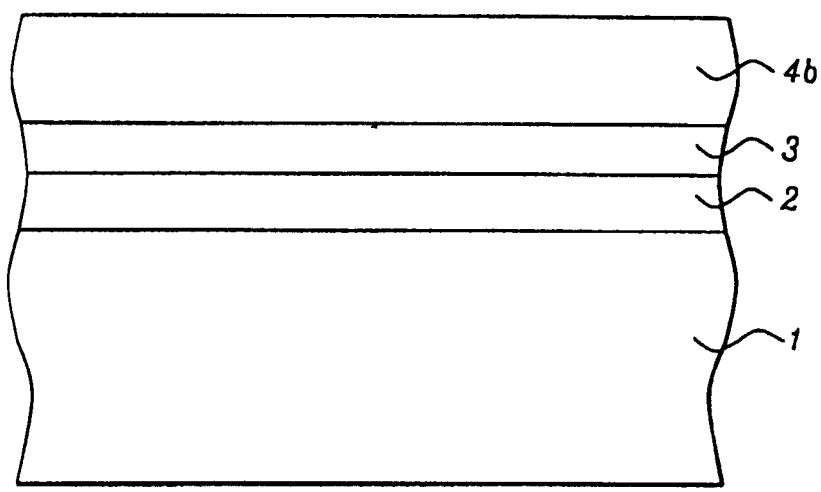

Growth of another semiconductor layer is next addressed, attempting to obtain a relaxed, low defect density layer. A first stage of obtaining a relaxed, low defect density layer initiates with a first stage of an epitaxial growth procedures, resulting in the epitaxial growth of thin strained layer 4a, wherein the thin strained layer is a semiconductor layer 4a, such as SiGe layer, and wherein the content of germanium in semiconductor layer 4a, is between about 5 to 80 weight percent. Thin, strained layer 4a, is again obtained via molecular beam epitaxy or via chemical vapor deposition featuring metal organic CVD procedures using silane, or disilane as a source for silicon, while germane is used as a source for germanium. This is schematically shown in FIG. 3. As the thickness of the overlying strained layer increases during a second stage of the epitaxial growth procedure, strain is induced in the underlying, initially unstrained silicon layer 3. When the strain in silicon layer 3, causes its critical thickness to decrease between its physical thicknesses, dislocations in silicon layer 3, will ensue converting initially unstrained silicon layer 3, to a strained silicon layer. In addition, and of utmost importance, the dislocation formation in strained silicon layer 3, results in relaxation of overlying strained layer 4a, resulting in a relaxed SiGe layer 4b, now at a final thickness between about 4000 Angstroms to several um. The natural lattice constant of SiGe layer 4b, is different than the natural lattice constant of underlying silicon layer 3. The result of the epitaxial grown is schematically shown in FIG. 4. Thus, the desired feature of forming a relaxed, low density layer, such as relaxed, low density semiconductor alloy layer 4b, is achieved, with this relaxed SiGe layer 4b, now providing a defect density of less than 1E3 defects/cm$^2$. The low defect density of layer 4b, which will subsequently be located underlying a strained silicon layer, will minimize the leakage path for subsequent MOSFET devices formed in a subsequently overlying strained silicon layer.

Figure 5:
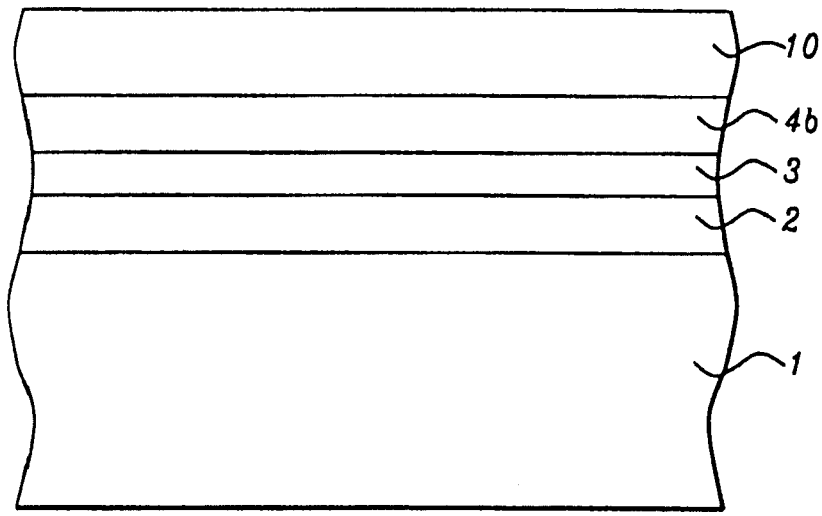

Critical, silicon layer 10, the desired layer to be used to accommodate the channel region for subsequent CMOS devices, is next epitaxially grown, and schematically shown in FIG. 5. Silicon layer 10, is epitaxially grown using silane or disilane as a source. The thickness of silicon layer 10, is less than its critical thickness to maintain the desired strain in silicon layer 10. Thus, the desired configuration needed to accommodate high performance, low leakage MOSFET devices, a strained silicon layer, on an underlying, relaxed low defect density layer, has been achieved via use of the above first embodiment of the invention.

Figure 6:
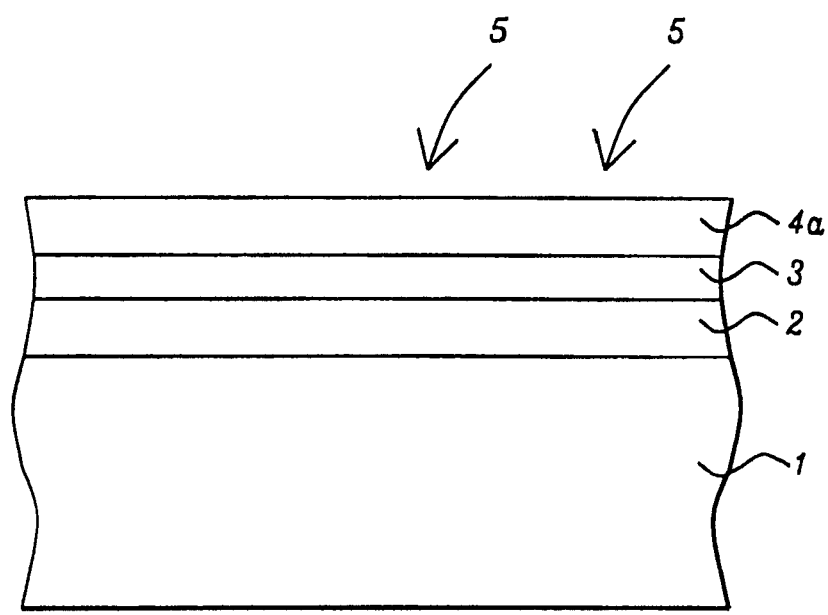
FIGS. 6-7, which schematically, in cross-sectional style, describe key stages in fabrication for a second embodiment of this invention, in which a strained silicon layer is formed on a relaxed, low defect density semiconductor alloy layer, wherein the semiconductor alloy layer was subjected to an anneal procedure performed either during or after the epitaxial growth to reduce the defect density of the annealed semiconductor alloy layer.
Figure 7:
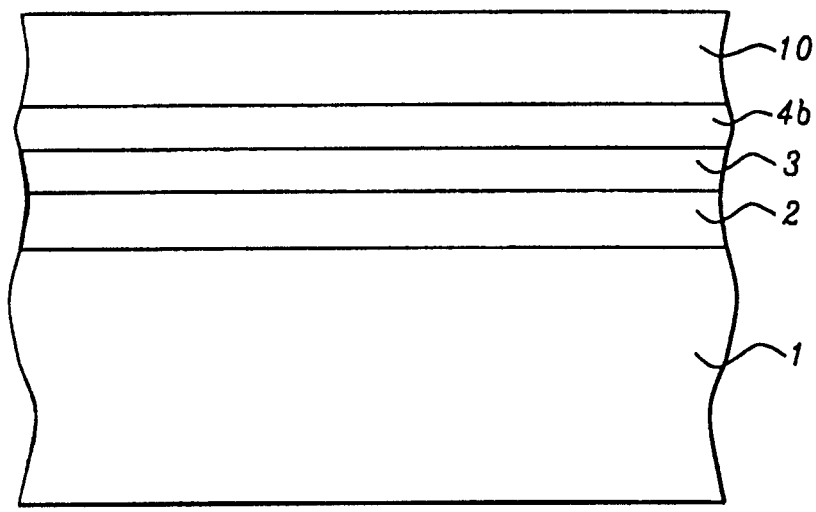

A second embodiment of this invention, the process of forming a strained silicon layer on a relaxed, low defect density semiconductor layer, is next addressed and schematically shown using FIGS. 6-7. Epitaxial growth of the identical composite layer described in the previous embodiment via growth conditions, and using thickness identical to those used and previously described for the first embodiment of this invention, is again performed, however, for this case followed by an anneal procedure. The anneal procedure results in additional relaxation of the overlying, SiGe layer, as well as additional decreases in defect density of this layer, when compared to counterpart SiGe layers not subjected to the anneal procedure. Anneal procedure 5, can be performed to thin, strained SiGe layer 4a, at a stage prior to completing the entire epitaxial growth procedure, then followed by additional epitaxial growth resulting in relaxed, low defect density, SiGe layer 4b, as shown schematically in FIG. 6. If desired, the anneal procedure can also be performed after the entire layer of the relaxed, low defect density layer has been realized. For either case, the anneal procedure is performed in an inert ambient, at a temperature between 800 to 1200° C., resulting in a final thickness for SiGe layer 4b, again between about 4000 Angstrom to several um. Critical, silicon layer 10, again the desired layer to be used to accommodate the channel region for subsequent CMOS devices, is next epitaxially grown, and schematically shown in FIG. 7. Silicon layer 10, is epitaxially grown using silane or disilane as a source. The thickness of silicon layer 10, is grown to a value less than its critical thickness to maintain the desired strain in silicon layer 10. The ability to epitaxially grow strained silicon layer 10, with enhanced tensile strain, is enhanced via the additional relaxation and decreased defect density of annealed SiGe. This is schematically shown in FIG. 7.

Figure 8:
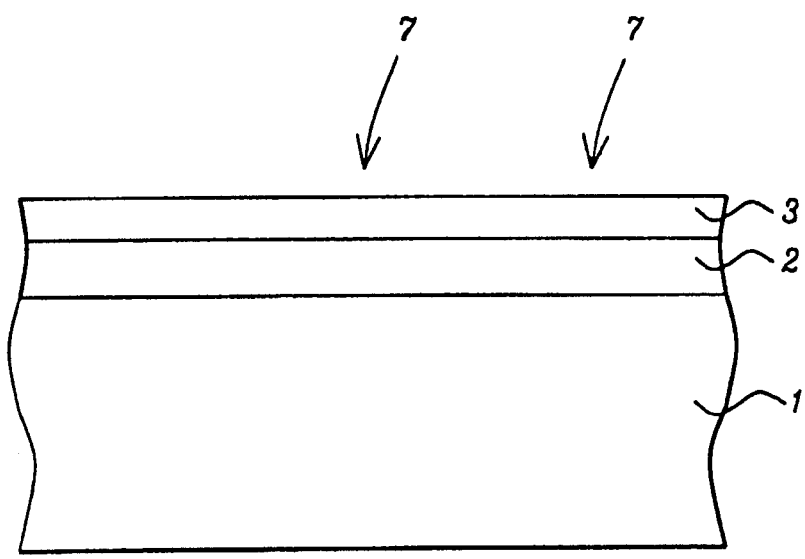
FIGS. 8-9, which schematically, in cross-sectional style, describe key stages of fabrication for a third embodiment of this invention, in which a silicon layer is subjected to ion implantation procedures to allow an overlying SiGe layer to be epitaxially grown, and now feature a defect density lower than defect densities of counterpart SiGe layers epitaxially grown on non-implanted silicon.
Figure 9:
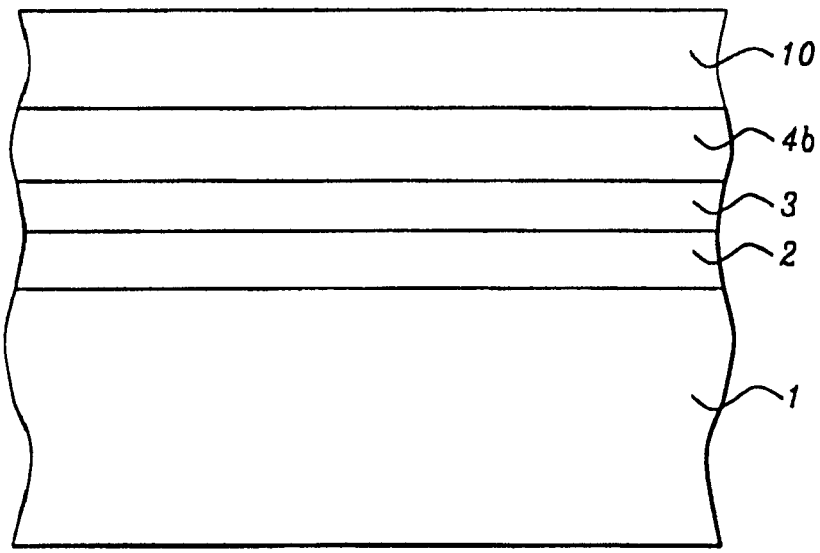

A third embodiment of this invention entails the use of ion implantation procedure 7, to weaken silicon layer 3, to allow overlying semiconductor alloy layer 4b, to be epitaxially grown again with increased relaxation and decreased defect density, when compared to counterpart layers formed on non-implanted, underlying silicon layers. The ability to obtain a relaxed, low defect density SiGe layer, improves the ability to subsequently grow a thin, strained silicon layer, under tensile strain. Growth of SiGe layer 4b, shown schematically in FIG. 8 featuring enhanced relaxation and low defect density, less than 1E3 defects/cm$^2$, as a result of epitaxial growth on an underlying, implanted silicon layer, is next accomplished at an identical thickness, as well as using identical process parameters, as used with counterpart SiGe layers described in the previous embodiments. The attainment of SiGe layer 4b, featuring the improved parameters, again allows the epitaxial growth of strained silicon layer 10, to be accomplished, wherein the critical thickness of strained silicon layer 10, is minimized to maintain strain, and to avoid relaxation. This is schematically shown in FIG. 9. If desired ion implantation procedure 7, can be applied to silicon layer 3, at some point after growth of an initial portion of strained layer 4b. This would be accomplished using an energy higher than the energy used for implantation prior to any growth of strained layer 4b.

Figure 10:
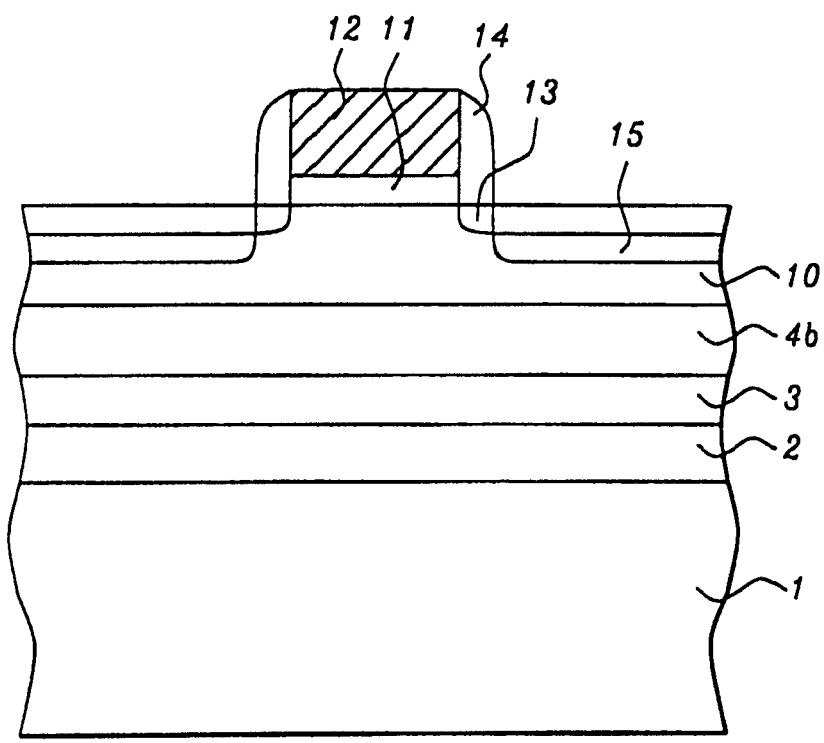
FIG. 10, which schematically, in cross-sectional style, describes a MOSFET device formed featuring a strained silicon layer.

The formation of a MOSFET device, with a channel region located in strained silicon layer 10, and with the leakage characteristics of the MOSFET device improved via formation on relaxed, low defect density, SiGe layer 4b, is next described and schematically shown in FIG. 10. Gate insulator layer 11, comprised of silicon dioxide is thermally grown in an oxygen-stream ambient. A conductive layer, such as doped polysilicon or metal is deposited on gate insulator layer 11. Photolithographic and dry etching procedures are next employed to define conductive gate structure 12. If desired, lightly doped source/drain region 13, is formed in regions of silicon layer 10, not covered by conductive gate structure 12. Lightly doped source/drain region 13, is obtained via ion implantation procedures, using either N type ions if an N channel MOSFET is desired, or using P type ions is a P channel MOSFET device is needed. Insulator spacers 14, such as silicon oxide or silicon nitride spacers, are formed on the sides of conductive gate structure 12, via deposition of the insulator layer followed by a blanket anisotropic dry etch procedure. Finally, heavily doped source/drain region 15, obtained via implantation of either N type, or P type ions, is formed in a region of strained silicon layer 10, not covered by conductive gate structure 12, or by insulator spacers 14.

Although the above-listed embodiments use a Si/SiGe combination, similar results can be obtained using a SiGe/SiGeC combination, in which SiGe is an initially unstrained layer, converted to a strained layer via dislocation formation induced via growth of an overlying strained SiGeC layer, with the overlying SiGeC layer relaxing, and featuring a low defect density, after conversion the underlying SiGe layer. Other combination of materials offering the ability to create strained channel regions include elemental, alloy, and compound semiconductors, (such as InGaAs/GaAs, AlGaAs/GaAs, and InGaN/GaN).

While this invention has been particularly shown and described with reference to, the preferred embodiments thereof, it will be understood by those skilled in the art that various changes in form and details may be made without departing from the spirit and scope of this invention.

What is claimed is:
1. A structure comprising:
a crystalline substrate;
a first crystalline layer of a first natural crystal lattice constant that is different from a lattice constant of said crystalline substrate, positioned above the crystalline substrate;
a second crystalline layer of a second natural crystal lattice constant that is different from the first natural crystal lattice constant of said first crystalline layer, positioned above the first crystalline layer, and comprising an elemental semiconductor, wherein the second crystal- line layer is an epitaxial layer of silicon having a thickness of less than 500 Angstroms;

a low defect density third crystalline layer of a third natural crystal lattice constant that is different from the second natural crystal lattice constant of said second crystalline layer and comprising a semiconductor alloy, on said second crystalline layer, as to promote creation of defects into at least said second crystalline layer, wherein growth of an initial portion of said low defect density third crystalline layer results in a strained layer however becoming a relaxed layer during growth of a final portion of said low defect density third crystalline layer, wherein the growth of the final portion is a growth provided after a time such that a critical thickness of the low defect density third crystalline layer is less than a physical thickness of the low defect density third crystalline layer, with relaxation of said low defect density third crystalline layer resulting in defects and dislocations induced in said underlying, second crystalline layer converting the second crystalline layer from a relaxed layer to a strained layer; and a strained thin fourth crystalline layer on said low defect density third crystalline layer, wherein a natural crystal lattice constant of said strained thin fourth crystalline layer is different from the third natural crystal lattice constant of said low defect density third crystalline layer and wherein the strained thin fourth crystalline layer includes a channel, a source, and a drain of a metal-oxide-semiconductor field effect transistor (MOSFET) device, and wherein an entirety of at least one of the source and the drain is disposed in the strained thin fourth crystalline layer.

2. The structure of claim 1, wherein said first crystalline layer is a semiconductor alloy.

3. The structure of claim 1, wherein the first crystalline layer is a strained layer.

4. The structure of claim 1, wherein the low defect density third crystalline layer is formed directly on said second crystalline layer.

5. The structure of claim 1, wherein the defect density of said low defect density third crystalline layer is less than 1E6 defects/cm$^2$.

6. The structure of claim 1, wherein the strained fourth crystalline layer is formed directly on the third crystalline layer.

7. The structure of claim 1, wherein said fourth crystalline layer is silicon.

8. A device comprising:

a first crystalline layer of a first natural lattice constant on a crystalline substrate, and wherein the first crystalline layer is a strained layer;

a second crystalline layer on said first crystalline layer, comprised with a second natural crystal lattice constant different from the first natural lattice constant, wherein the second crystalline layer is an epitaxial layer of silicon having a thickness of less than 500 Angstroms;

a third crystalline layer on said second crystalline layer, comprised with a third natural crystal lattice constant different than said second natural crystal lattice constant, and wherein the third crystalline layer is a relaxed, low-defect density layer, wherein growth of the third crystalline layer includes relaxing a strain in the third crystalline layer to form a relaxed third crystalline layer, with relaxation of the strain resulting in defects and dislocations induced in the second crystalline layer thereby converting the second crystalline layer from a relaxed layer to a strained layer;

a strained fourth crystalline layer on said third crystalline layer;

a channel region of a metal-oxide-semiconductor field effect transistor (MOSFET) device located in said strained fourth crystalline layer; and a source region and a drain region of the MOSFET device located entirely in said strained fourth crystalline layer.

* * * * *